(12) United States Patent
Kam et al.

(10) Patent No.: US 7,323,802 B2
(45) Date of Patent: Jan. 29, 2008

(54) SURFACE ACOUSTIC WAVE DEVICE

(75) Inventors: Chan Hin Kam, Singapore (SG); Yee Loy Lam, Singapore (SG); Yan Zhou, Pleasanton, CA (US); Shide Cheng, Pleasanton, CA (US); Woon Siong Gan, Singapore (SG)

(73) Assignees: Acoustical Technologies Singapore Pte. Ltd., Singapore (SG); Nanyang Technological University, Singapore (SG)

( * ) Notice: Subject to any disclaimer, the term of this patent is extended or adjusted under 35 U.S.C. 154(b) by 0 days.

(21) Appl. No.: 10/296,413

(22) PCT Filed: Apr. 27, 2001

(86) PCT No.: PCT/SG01/00074

§ 371 (c)(1),
(2), (4) Date: Sep. 22, 2003

(87) PCT Pub. No.: WO01/93420

PCT Pub. Date: Dec. 6, 2001

(65) Prior Publication Data

US 2004/0056561 A1    Mar. 25, 2004

(30) Foreign Application Priority Data

May 31, 2000    (GB) ................... 0013275.3

(51) Int. Cl.
*H01L 41/08*    (2006.01)

(52) U.S. Cl. ................. 310/313 B; 310/313 R

(58) Field of Classification Search ............ 310/313 B, 310/313 C, 313 D, 313 R
See application file for complete search history.

(56) References Cited

U.S. PATENT DOCUMENTS 3,955,160 A    5/1976    Duffy ................. 333/30 R (Continued)

FOREIGN PATENT DOCUMENTS

DE    3838923    6/1989

(Continued)

OTHER PUBLICATIONS

Dransfield et al., "Excitation, Detection and Attenuation of High-Frequency Elastic Surface Waves," Physical Acoustics, Principles and Methods, W.P. Mason and R.N. Thurston ed., vol. Vii, pp. 219,272, Academic Press, 1970.

(Continued)

*Primary Examiner*—Mark Budd
(74) *Attorney, Agent, or Firm*—Nicholas A. Kees; Godfrey & Kahn, S.C.

(57) ABSTRACT

A surface acoustic wave device that can operate in alternate-phase mode and single-phase mode, and thus generate surface acoustic waves at two different frequencies. The device is based on a piezoelectric film deposited on an elastic substrate, and includes an electrode layer patterned as two interdigital electrodes and electrical source (2). The device is operated in alternate-phase mode by connecting the two electrodes to different ends of an electrical source (22). The device is operated in single-phase mode by connecting the two electrodes to the same end of an electrical source.

8 Claims, 6 Drawing Sheets

U.S. PATENT DOCUMENTS

| | | | |
|---|---|---|---|
| 4,437,031 A | 3/1984 | Gunshor et al. | 310/313 B |
| 4,456,847 A * | 6/1984 | Minagawa et al. | 310/313 R |
| 4,491,811 A | 1/1985 | Niitsuma et al. | 333/151 |
| 4,507,581 A | 3/1985 | Tabuchi et al. | 310/313 B |
| 4,531,107 A | 7/1985 | Okamoto et al. | 333/194 |
| 4,683,394 A * | 7/1987 | Koshino | 310/313 R |
| 5,006,749 A * | 4/1991 | White | 310/323.03 |

FOREIGN PATENT DOCUMENTS

| | | |
|---|---|---|
| EP | 0534411 A1 | 3/1993 |
| JP | 61-136314 | 6/1986 |
| JP | 10-62911 | 9/1989 |

OTHER PUBLICATIONS

Day et al., "Annular Piezoelectric Surface Waves," IEEE Transactions on Sonics and Ultrasonics, vol. SU-19, No. 4, pp. 461-466, Oct. 1972.

Shih et al., "Theoretical Investigation of the SAW properties of Ferroelectric Film Composite Structures," IEEE Transaction on Ultrasonics, Ferroelectrics, and Frequency Control, vol. 45, No. 2, pp. 305-316, Mar. 1998.

* cited by examiner

SURFACE ACOUSTIC WAVE DEVICE

This invention relates to surface acoustic wave (SAW) devices, and more particularly to a SAW device based on piezoelectric thin films.

SAW devices and related subject matter are described in the following publications:
U.S. Pat. No. 3,955,160;
U.S. Pat. No. 4,437,031;
U.S. Pat. No. 4,456,847;
U.S. Pat. No. 4,491,811;
U.S. Pat. No. 4,507,581;
U.S. Pat. No. 4,531,107;
Dransfield et al., "Excitation, Detection and Attenuation of High-Frequency Elastic Surface Waves", Physical Acoustics, Principles and Methods, W. P. Mason and R. N. Thurston ed., Vol. VII, pp. 219-272, Academic Press, 1970; and
Shih et al., "Theoretical Investigation of the SAW properties of Ferroelectric Film Composite Structures", IEEE Transactions on Ultrasonics, Ferroelectrics, and Frequency Control, Vol. 45, No. 2, pp. 305-316, March 1998.

A SAW device is constructed so that electrical signals are transformed into acoustic surface waves by a transducer formed on a piezoelectric substrate, and the acoustic surface waves propagate on the surface of the substrate. The device is fabricated using piezoelectric materials, such as a piezoelectric crystal, $LiNbO_3$, Quartz, etc., piezoelectric ceramic material, $Pb(ZrTi)O_3$ (PZT), ZnO, etc., or a piezoelectric thin film deposited on a non-piezoelectric substrate, such as ZnO on silicon. The SAW device comprises a pair of electro-SAW transducers and a SAW propagation path established therebetween. Usually, the SAW propagation path is constituted by a part of the polished piezoelectric substrate which is used in common for both transducers.

An acoustic wave with a frequency as high as several gigahertz travels on the substrate surface at a velocity which is about $10^{-5}$ times that of electromagnetic waves. A surface acoustic wave thus has the slow travel property of sound while retaining the microwave frequency of its source. SAW devices utilizing these properties can be used in delay lines, filters, pulse processors and other microwave devices and circuits.

In a SAW delay line, the delay time is determined by the velocity of the surface acoustic wave and the distance travelled by the surface acoustic wave on a piezoelectric surface.

In a SAW filter, the frequency characteristics of the filter are determined mainly by the sound velocity of the SAW and the electrode patterns of the input and output transducers.

Generally, the electrode pattern of a transducer includes a plurality of parallel electrode strips. The orientation of the strips determines the direction of a wave front.

In a single-phase transducer, all the electrode strips are maintained at a single phase, with one electrode strip and one gap region between electrode strips defining a region for one wavelength.

In an interdigital transducer, electrode strips are formed at an interval of ½ wavelength, and two-phase control is carried out. More particularly, two comb-shaped electrodes each having a plurality of electrode fingers (strips) are opposed and interlocked and maintained at opposite phases. This is known as alternate-phase mode. Two electrode strips and two gap regions between the strips define a region for one wavelength. Typically, the electrode strips and the gap regions all have the same width $l$ which is $\lambda/4$, where $\lambda$ represents the wavelength of a SAW.

Generally, conventional transducers can be operated in only one mode, either single-phase mode or alternate-phase mode. An object of the invention is to combine these two modes and develop a new type of SAW device that can be operated at two different frequencies.

According to a first aspect of the invention, there is provided a surface acoustic wave device, comprising: an electrode layer patterned as two electrodes with an interdigital arrangement; a piezoelectric layer; an elastic substrate layer; means for providing connection of both electrodes to the same end of an electrical source to operate the device in single-phase mode; and means for providing connection of each electrode to a different end of an electrical source to operate the device in alternate-phase mode.

According to a second aspect of the invention, there is provided a method of operating a surface acoustic wave device, the device comprising an electrode layer patterned as two electrodes with an interdigital arrangement, a piezoelectric layer and an elastic substrate layer, the method comprising: connecting both electrodes to the same end of an electrical source to operate the device in single-phase mode; and connecting each electrode to a different end of the electrical source to operate the device in alternate-phase mode.

The patterned electrode layer may be a top electrode layer located on the side of the piezoelectric layer away from the substrate layer. The device may further include an underlay electrode layer located between the piezoelectric layer and the substrate layer.

The patterned electrode layer may be an underlay electrode layer located between the piezoelectric layer and the substrate layer, and the device further comprising a top electrode layer located on the side of the piezoelectric layer away from the substrate layer.

The device may further include a buffer layer located between the underlay electrode layer and the substrate layer.

A surface acoustic wave device based on a piezoelectric thin film deposited on a non-piezoelectric substrate has been designed. The device can be operated in alternate-phase mode or single-phase mode, and thus the device can generate surface acoustic waves at two different frequencies. The device has been termed a "single-phase/alternate-phase SAW device".

For a better understanding of the present invention, specific embodiments will now be described, by way of example, with reference to the accompanying drawings, in which.

Figure 1:
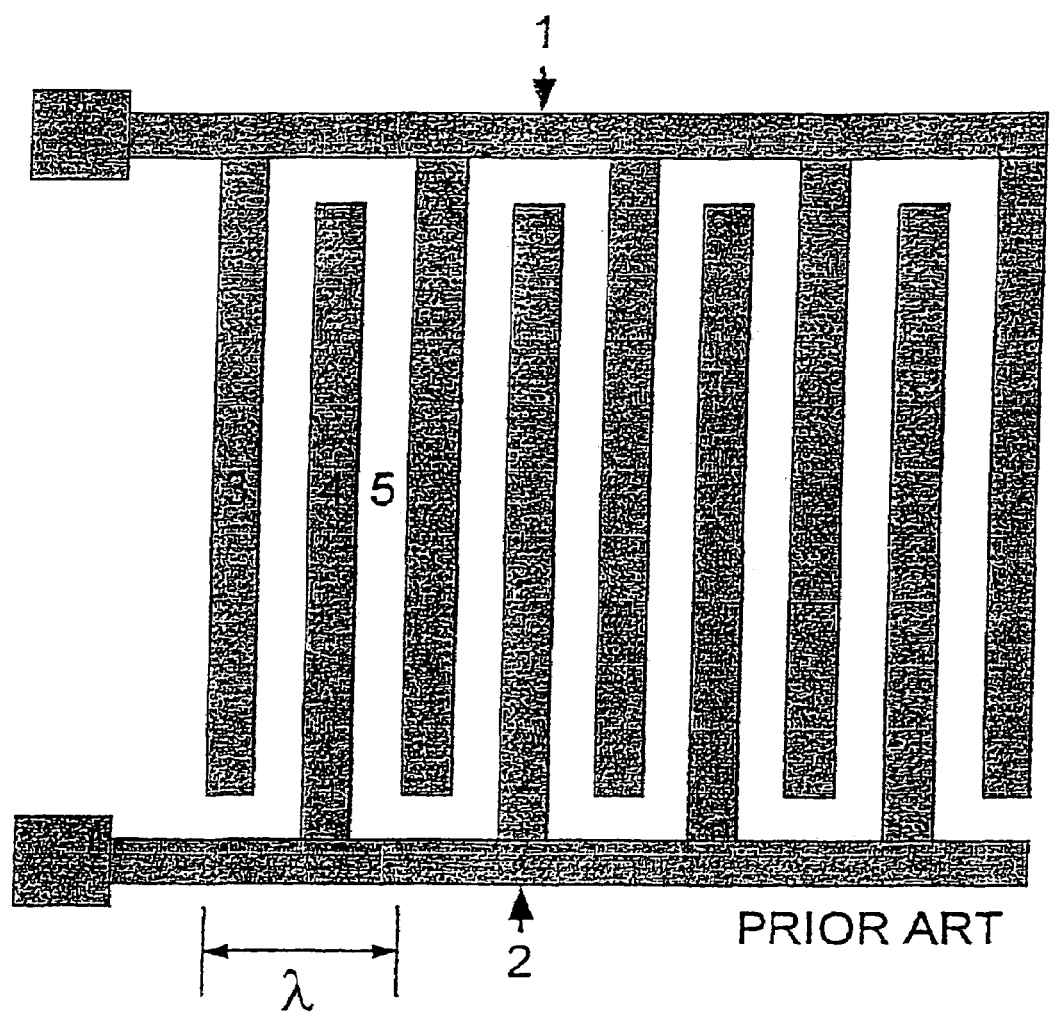
FIG. 1 is a top view of a known interdigital transducer configuration.

As shown in FIG. 1, a conventional interdigital transducer consists of two electrodes 1 and 2, each comprising an arm having a plurality of fingers 3 and 4. The fingers are electrode strips extending from the arm, and are alternately spaced with respect to one another along a non-conductive surface 5, with non-conductive gap regions between the fingers. As indicated in FIG. 1, the width of each of the conductive fingers and the non-conductive gaps therebetween is equal to $\lambda/4$ where $\lambda$ is the SAW wavelength. The upper limit of the operating frequency of a SAW device is determined by the capability of the photolithographic techniques being used to define the transducer.

Figure 2A:
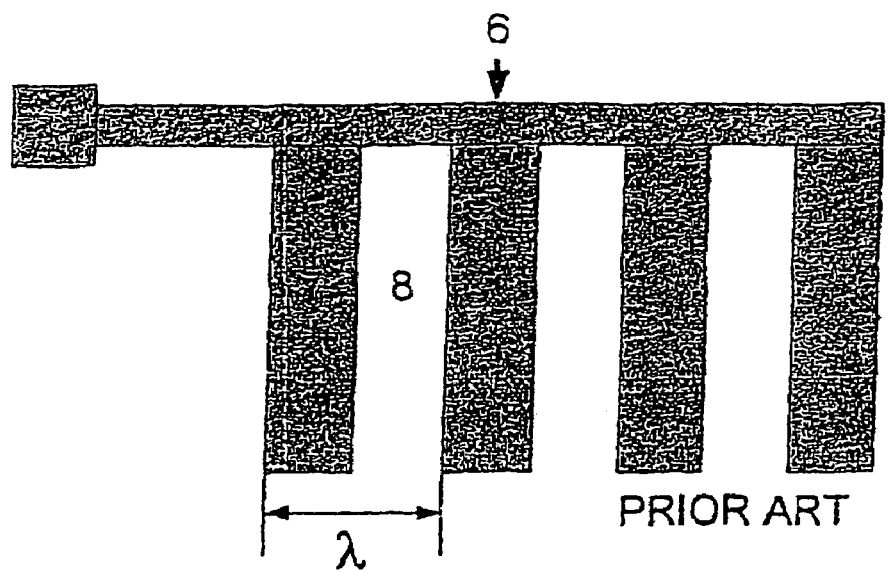
FIG. 2A is a top view of a known single-phase transducer configuration with conductive and non-conductive strips of width $\lambda/2$.

A single-phase transducer configuration, as shown in FIG. 2A, doubles the operating frequency possible for a given photolithographic capability. In FIG. 2A, a single-phase transducer includes a conducting arm 6 having a plurality of conductive fingers 7 extending from the arm, with non-conductive gap regions 8 between the fingers. As indicated, the spacing between the fingers, as well as the width of each finger is $\lambda/2$, where $\lambda$ is the SAW wavelength.

Figure 2B:
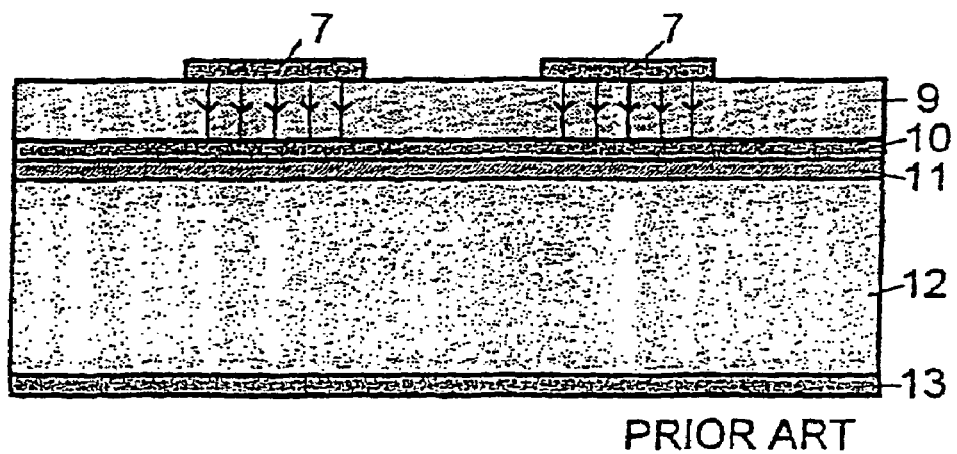
FIG. 2B is a side schematic view to illustrate a typical electric field pattern for a ZnO/Si single-phase transducer.

A side view of a single-phase transducer in a layered configuration is shown in FIG. 2B. The transducer includes a top electrode layer patterned as shown in FIG. 2A with fingers 7. Below this, the transducer includes ZnO layer 9, Al underlay electrode layer 10, SiO$_2$ buffer layer 11, silicon layer 12 and Al electrode layer 13. The electric field lines are generally parallel since the thickness of the ZnO layer 9 is typically three to ten times smaller than the spacing between the electrode fingers 7.

Figure 2C:
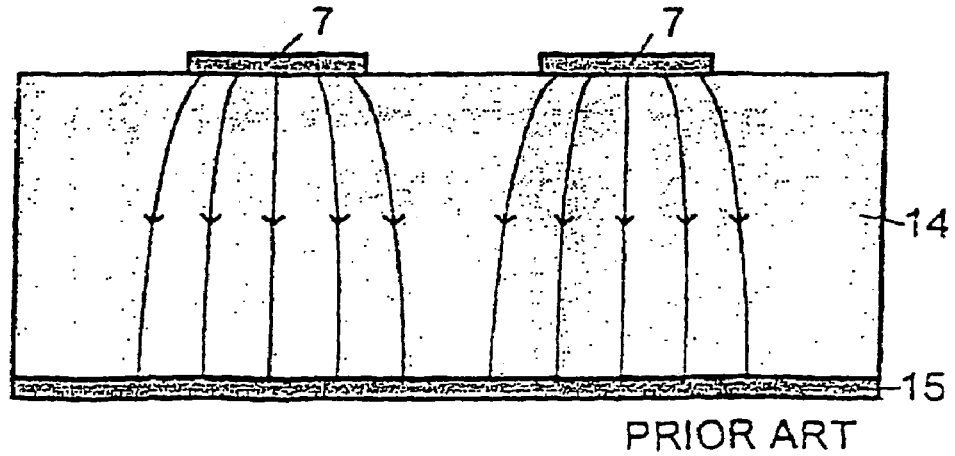
FIG. 2C is a side schematic view to illustrate a typical electric field pattern for a single-phase $LiNbO_3$ transducer.

In contrast, a single-phase transducer in a single crystal configuration is shown in FIG. 2C. In this case, the spacing between the electrode fingers 7 is much smaller than the crystal thickness. Therefore, fringing of the electric fields occurs as depicted. In FIG. 2C, the single-phase patterned electrode layer with conductive fingers 7 is positioned on a LiNbO$_3$ substrate 14, and a back electrode 15 is deposited at the back side of the LiNbO$_3$ substrate. The inherent difference in the field pattern between the layered crystal structure and the single crystal structure makes the single-phase transducer in the layered configuration much more efficient than its counterpart in the single crystal configuration.

Figure 3A:
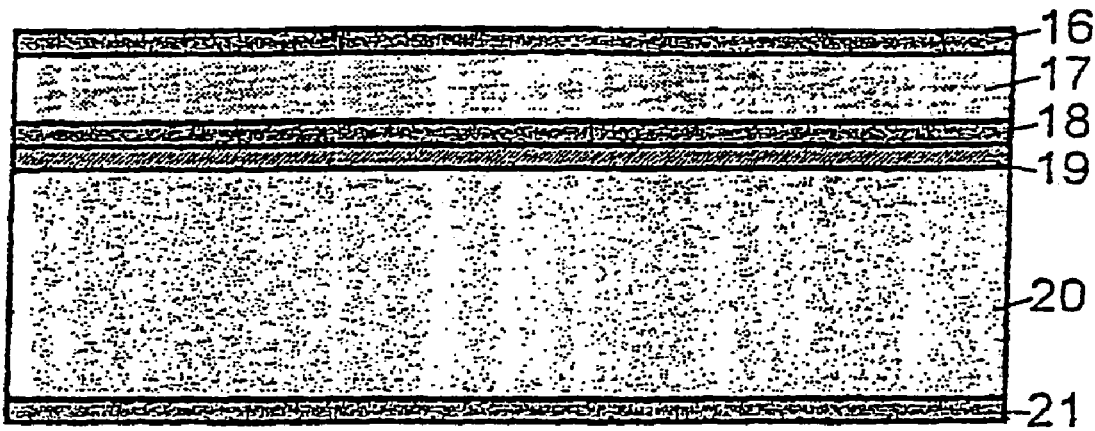
FIG. 3A is a side schematic view of a substrate that is suitable for single-phase/alternate-phase SAW device fabrication.
Figure 3B:
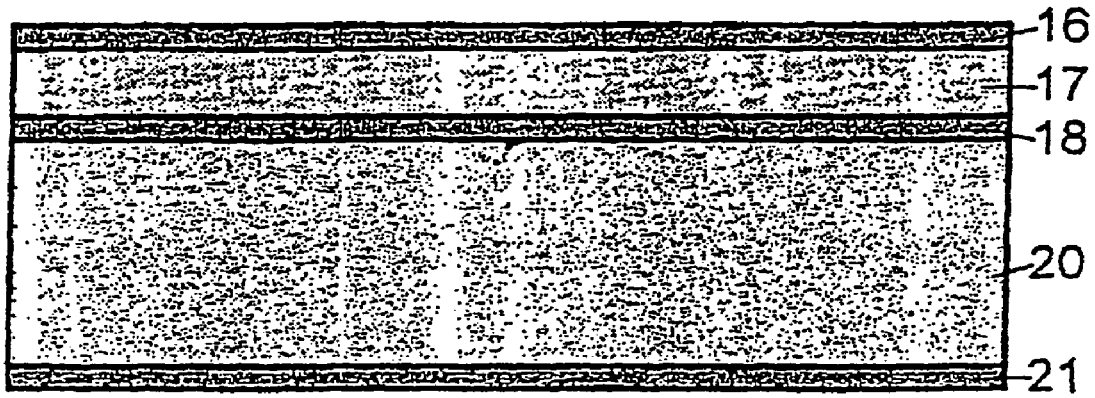
FIG. 3B is a side schematic view of another substrate that is suitable for single-phase/alternate-phase SAW device fabrication.
Figure 3C:
FIG. 3C is a side schematic view of another substrate that is suitable for single-phase/alternate-phase SAW device fabrication.
Figure 6A:
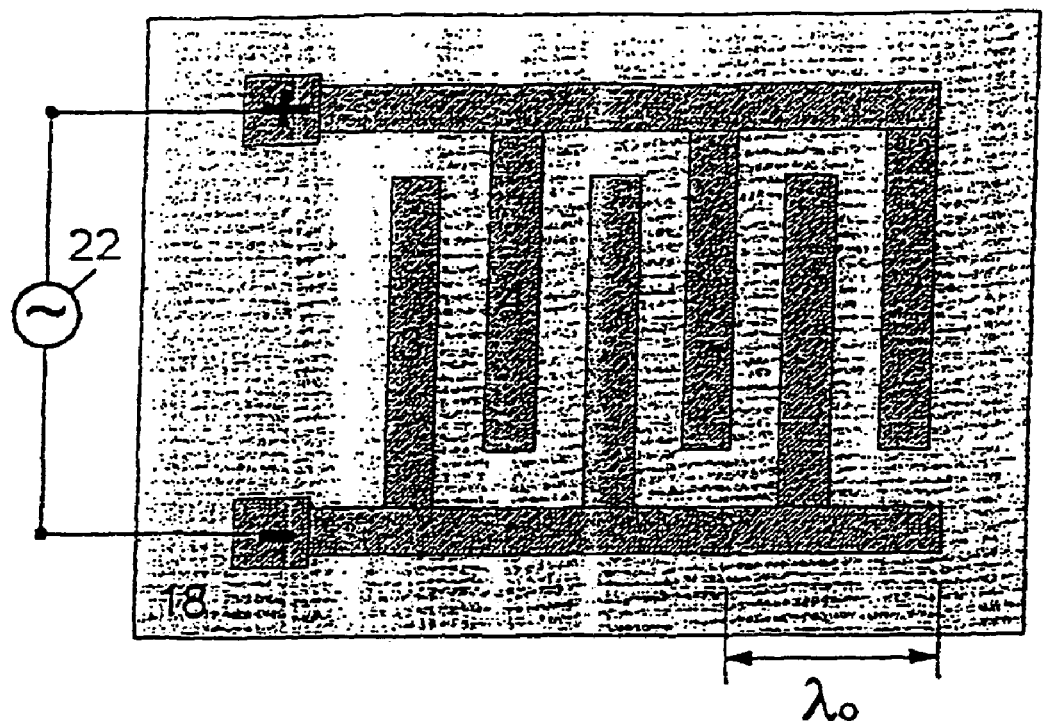
FIG. 6A is a plan view of the patterned electrode layer of an embodiment, showing the electrical connections for the embodiment when operating in alternate-phase mode.

FIGS. 3A, 3B and 3C show side schematic views of substrates that are suitable for embodiments of single-phase/alternate-phase SAW device fabrication. In FIG. 3A, the substrate includes the top electrode layer 16 (Al, Au, etc.), the piezoelectric thin film layer 17 (ZnO, PZT, LiNbO$_3$, LiTaO$_3$, etc.), the underlay electrode layer 18 (Al, Au, etc.), the buffer layer 19 (SiO$_2$, Si$_3$N$_4$, diamond, etc.), the elastic substrate layer 20 (sapphire, Si, GaAs, InP, fused silica, glass, etc.),and the back electrode layer 21 (Al, FIG. 6A is a plan view of the patterned electrode layer (which may be either layer 16 or 18) of the embodiments showing the electrical connections for an embodiment operating in alternate-phase mode. The two comb-shaped electrodes are connected to the two different ends of an electrical source 22. The surface acoustic wavelength is $\lambda_o$ and the operating frequency is $f_o = v/\lambda_o$, where v is the velocity of the surfaces acoustic wave.

Figure 6B:
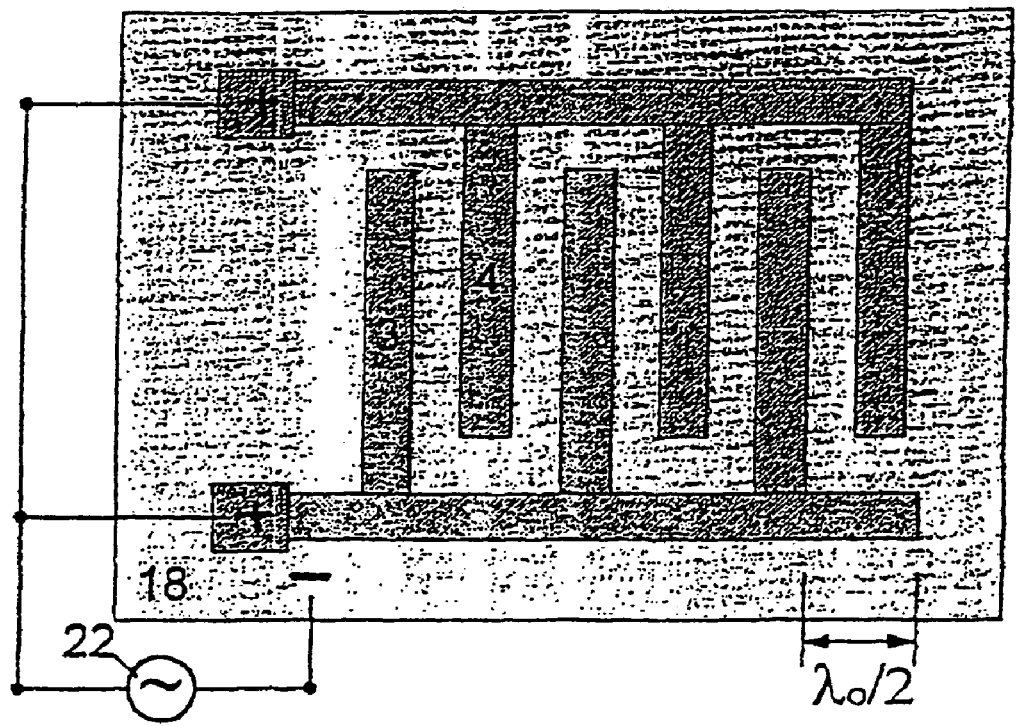
FIG. 6B is a plan view of the patterned electrode layer of an embodiment, showing the electrical connections for the embodiment when operating in single-phase mode.

FIG. 6B is a plan view of the patterned electode layer (which may be either layer 16 or 18) of the embodiments showing the electrical connections for an embodiment operating in single-phase mode. The two comb-shaped electrodes are connected to the same end of an electrical source 22. The other end of the electrical source 22 may be connected to the underlay electrode 18, for example as in the first embodiment (FIG. 4A), or the top electrode 16, for example as in the second embodiment (FIG. 4B).

For single-phase mode compared with alternate-phase mode, the surface acoustic wavelength is halved, $\lambda = \lambda_o/2$ and the frequency is doubled, $f = 2f_o$.

A single-phase/alternate-phase SAW device may be fabricated using any of the substrates illustrated in FIGS. 3A to 3C. Either the top electrode layer 16 is patterned or the underlay electrode layer 18 is patterned, for example, in the manner illustrated in FIG. 1.

The piezoelectric layer 17 may be a polycrystalline or single crystal material. The piezoelertic layer 17 may be formed of, for example, ZnO, PZT, LiNbO$_3$, LiTaO$_3$, etc.

The buffer layer 19 is a dielectric thin film, such as SiO$_2$, Si$_3$N$_4$, diamond film, etc. This layer is generally included to improve the crystallinity or texture of the piezoelectric layer. It can also be used to increase the speed of the SAW.

Au, etc.). In FIG. 3B, the buffer layer 19 is absent, whilst in FIG. 3C, both the underlay electrode layer 18 and buffer layer 19 are absent.

The term "elastic substrate layer" means any substrate which has a linear relationship between its stress and strain. Thus, an elastic SAW can travel on it.

An underlay electrode was described by Shih et al. in "Theoretical Investigation of the SAW properties of Ferroelectric Film Composite Structures", IEEE Transactions on Ultrasonics, Ferroelectrics, and Frequency. Control, Vol. 45, No. 2, pp.305-316, March 1998. Shih et al. used the underlay electrode as a floating electrode to enhance the electromechanical coupling efficiency of a device. Thus, the transducer only operates in alternate-phase mode.

FIGS. 4A, 4B, 5A and 5B are side schematic views showing embodiments of single-phase/alternate-phase SAW devices.

Figure 4A:
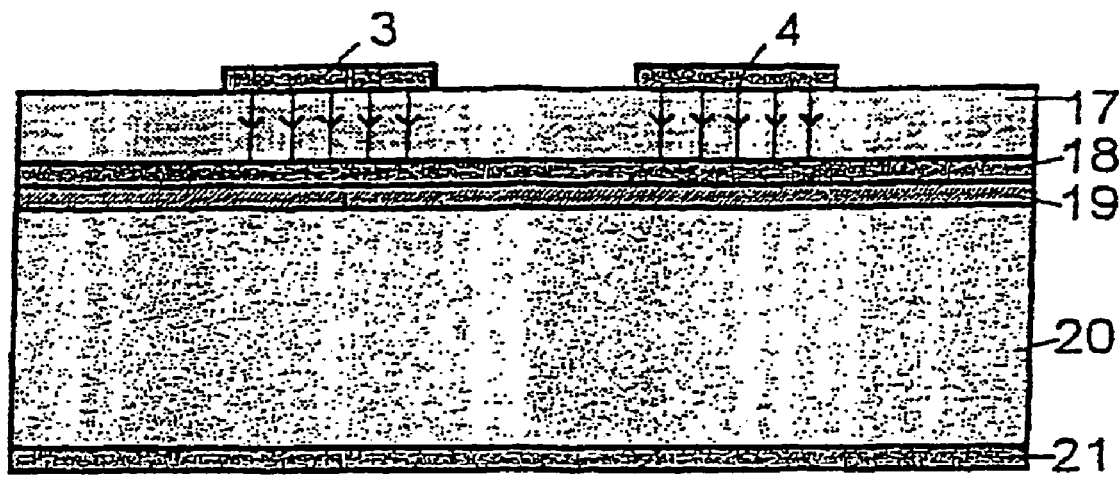
FIG. 4A is a side schematic view showing a typical electric field pattern for the single-phase mode of a first embodiment of a single-phase/alternate-phase SAW device.
Figure 4B:
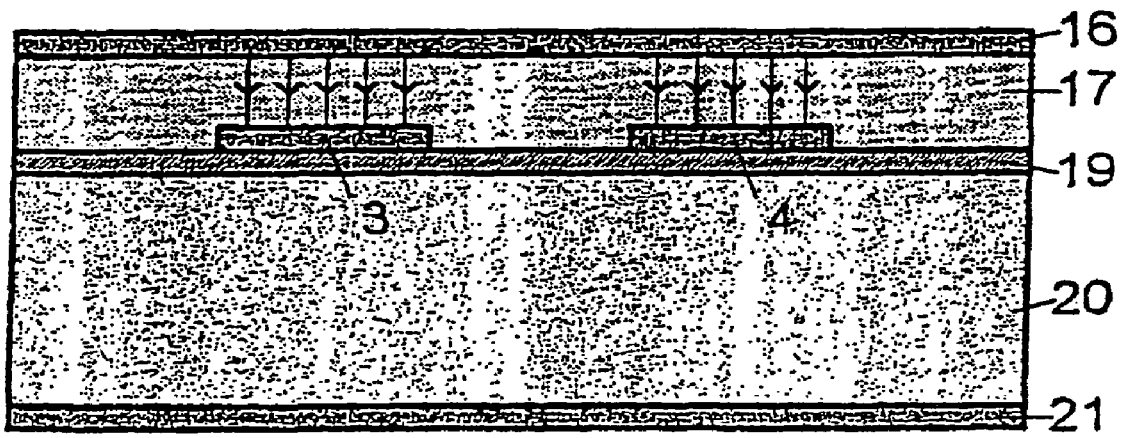
FIG. 4B is a side schematic view showing a typical electric field pattern for the single-phase mode of a second embodiment of a single-phase/alternate-phase SAW device.
Figure 5A:
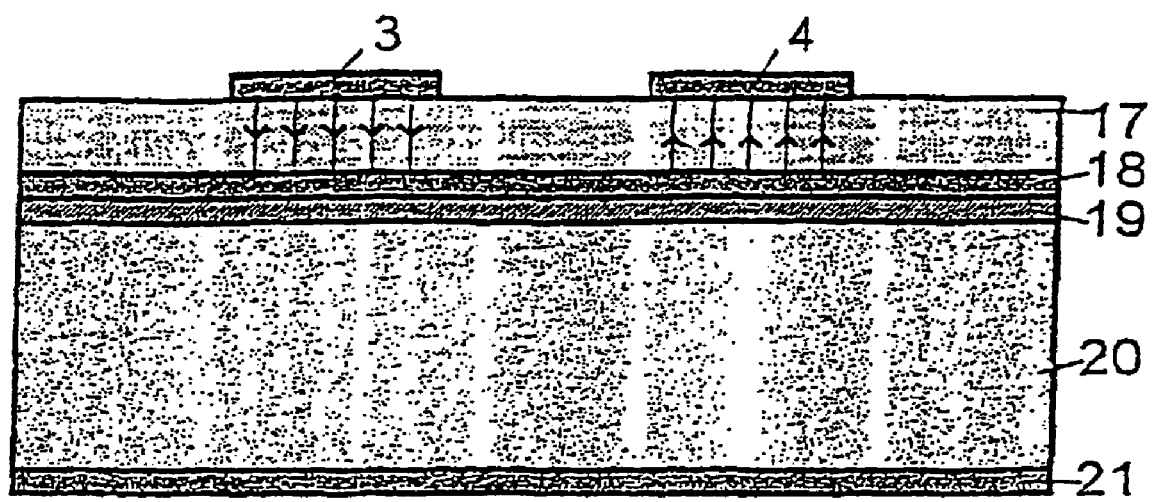
FIG. 5A is a side schematic view showing a typical electric field pattern for the alternate-phase mode of the first embodiment of a single-phase/alternate-phase SAW device.

For the first embodiment, shown in FIGS. 4A and 5A, the substrate of FIG. 3A has been used, and the top electrode layer 16 patterned with the interdigital electrode pattern shown in FIG. 1, including conductive fingers 3 and 4. Underlay electrode layer 18 is unpatterned. FIG. 4A shows the electric field pattern for the first embodiment operating in single-phase mode, i.e. all the conductive fingers 3 and 4 are maintained at the same phase. FIG. 5A shows the electric field pattern for the first embodiment operating in alternate-phase mode, i.e. alternating conductive fingers 3 and 4 are maintained at opposite phases.

Figure 5B:
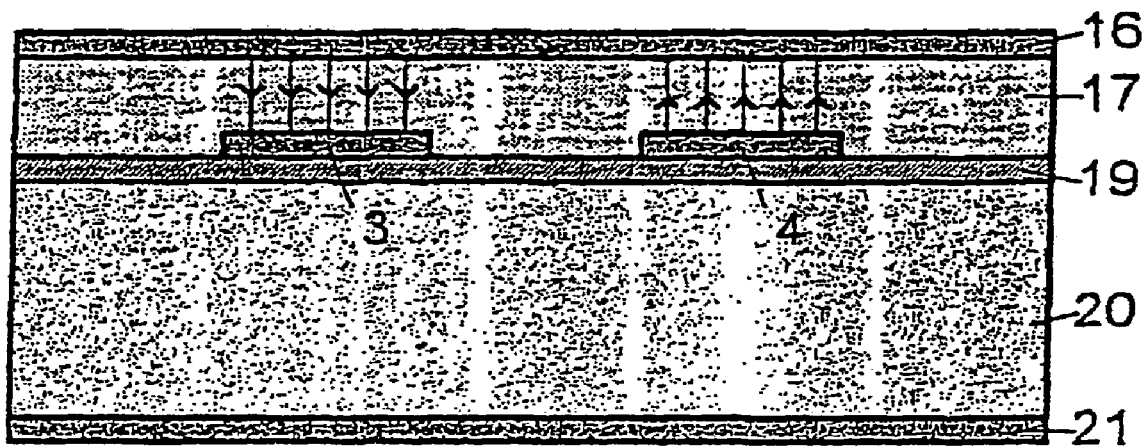
FIG. 5B is a side schematic view showing a typical electric field pattern for the alternate-phase mode of the second embodiment of a single-phase/alternate phase SAW device.

For the second embodiment, shown in FIGS. 4B and 5B, the substrate of FIG. 3A has been used, and the underlay electrode layer 18 patterned with the interdigital electrode pattern shown in FIG. 1, including conductive fingers 3 and 4. Top electrode layer 16 is unpatterned. FIG. 4B shows the electric field pattern for the second embodiment operating in single-phase mode, while FIG. 5B shows the electric field pattern for the second embodiment operating in alternate-phase mode.

Each electrode layer may comprise a thin metal film, such as Al, Au, Ag, Ti, or a conductive thin oxide film, such as Al:ZnO, ITO, ATO, or a semiconductor film, such as p-type silicon.

The elastic substrate layer 20 may be a crystalline material, such as sapphire, $SrTiO_3$, etc. or a non-crystalline, acoustically isotropic material, such as fused silica, glass, etc. or a conductive material such as aluminium, tungsten, etc. or a semiconductor material such as Si, Ge, GaAs, InP, AlN, GaN, etc.

In the case where a single-phase/alternate-phase SAW device is fabricated using the substrate of FIG. 3C, then the substrate layer will be either a conductive or semiconductor material, and the top electrode layer 16 will be patterned. To operate this device in single-phase mode, the top electrode 16 is connected to one end of the electrical source 22 and the back electrode 21 is connected to the other end of the electrical source 22. The substrate 20 serves as the floating electrode to enhance the electromechanical coupling efficiency of the device.

These single-phase/alternate-phase SAW devices can use the substrate more efficiently and are more versatile than conventional SAW devices. They can be used in SAW delay lines, resonators and filters. By using semiconductors as the substrate, it is also possible to integrate SAW devices and electrical circuits on the same chip.

The invention claimed is:

1. A surface acoustic device comprising:
    at least one electrode layer including a first electrode having a first interdigital arrangement and a first electrical connection portion, and a second electrode having a second interdigital arrangement and a second electrical connection portion;
    a piezoelectric layer operatively associated with the electrode layer;
    an elastic substrate layer;
    an electrical source having a first output associated with a first polarity and a second output associated with a second polarity, wherein the first output is coupled directly to the first electrical connection portion and the first output is also coupled directly to the second electrical connection portion to facilitate operation of the surface acoustic wave device in a single-phase mode; and
    wherein the second output is coupled to the substrate layer.

2. The surface acoustic wave device of claim 1 wherein the at least one electrode layer is a top electrode layer located on a side of the piezoelectric layer away from the elastic substrate layer.

3. The surface acoustic wave device of claim 1 wherein the at least one electrode layer is an underlay electrode layer located between the piezoelectric layer and the elastic substrate layer.

4. The surface acoustic wave device of claim 3 further comprising:
    a buffer layer located between the underlay electrode layer and the elastic substrate layer.

5. A method of operating a surface acoustic wave device in a single-phase mode, the method comprising the steps of:
    providing at least one electrode layer including a first electrode having a first interdigital arrangement and a first connection portion, and a second electrode having a second interdigital arrangement and a second connection portion;
    providing a piezoelectric layer operatively associated with the electrode layer;
    providing an elastic substrate layer;
    providing an electrical source having a first output associated with a first polarity and a second output associated with a second polarity;
    coupling the first output to the first electrical connection portion;
    coupling the first output to the second electrical connection portion to facilitate operation of the surface acoustic wave device in the single-phase mode; and
    coupling the second output to the substrate layer.

6. The method of claim 5 wherein the at least one electrode layer is a top electrode layer located on a side of the piezoelectric layer away from the elastic substrate layer.

7. The method of claim 5 wherein the at least one electrode layer is an underlay electrode layer located between the piezoelectric layer and the elastic substrate layer.

8. The method of claim 7 further comprising:
    providing a buffer layer located between the underlay electrode layer and the elastic substrate layer.

* * * * *